United States Patent [19]
Bajor et al.

[11] Patent Number: 5,504,033
[45] Date of Patent: Apr. 2, 1996

[54] METHOD FOR FORMING RECESSED OXIDE ISOLATION CONTAINING DEEP AND SHALLOW TRENCHES

[75] Inventors: George Bajor, Melbourne; Anthony L. Rivoli, Palm Bay, both of Fla.

[73] Assignee: Harris Corporation, Melbourne, Fla.

[21] Appl. No.: 339,966

[22] Filed: Nov. 15, 1994

Related U.S. Application Data

[62] Division of Ser. No. 935,765, Aug. 26, 1992, Pat. No. 5,382,541.

[51] Int. Cl.$^6$ ............................................. H01L 21/302
[52] U.S. Cl. ........................................ 437/67; 437/62
[58] Field of Search .................... 437/62, 67, 68, 437/228, 225, 974; 148/DIG. 50, DIG. 85, DIG. 86, DIG. 12; 257/374

[56] References Cited

U.S. PATENT DOCUMENTS

| | | | |
|---|---|---|---|
| 4,988,639 | 1/1991 | Aomura | 437/67 |
| 5,006,482 | 9/1991 | Kerbaugh et al. | 437/67 |
| 5,036,021 | 7/1991 | Goto | 437/67 |
| 5,173,439 | 12/1993 | Dash et al. | 437/67 |
| 5,270,265 | 12/1993 | Hamenway et al. | 437/67 |
| 5,336,634 | 7/1994 | Katayama et al. | 437/67 |

FOREIGN PATENT DOCUMENTS

| | | |
|---|---|---|
| 0120614 | 2/1984 | European Pat. Off. . |
| 0300569 | 1/1989 | European Pat. Off. . |
| 0398468 | 11/1990 | European Pat. Off. . |
| 0405923 | 1/1991 | European Pat. Off. . |
| 58-169933 | 10/1983 | Japan ........ 437/68 |
| 61-228650 | 10/1986 | Japan . |
| 61-256649 | 11/1986 | Japan . |
| 61-289642 | 12/1986 | Japan ........ 437/67 |
| 1-309373 | 12/1989 | Japan ........ 437/67 |
| 254556 | 2/1990 | Japan . |

OTHER PUBLICATIONS

IBM Technical Disclosure Bulletin, vol. 33, No. 4, Sep. 1990, New York U.S., pp. 210–212, "Shallow Trench Formation Using Polysilicon Trench Refill".

Patent Abstracts of Japan, vol. 015, No. 498, (E–1146), Dec. 17, 1991.

Patent Abstract of Japan, vol. 009, No. 150, (E–324), (1873), Jun. 25, 1985.

H. Nishizawa, et al., "1991 Symposium on VLSI Technology Digest of Technical Papers," Institute of Electrical & Electronics Electronics Engineers Procedings of the Symposium on VLSI Technology, pp. 51–52, (1991).

Primary Examiner—George Fourson
Assistant Examiner—S. Mulpuri
Attorney, Agent, or Firm—Nixon, Hargrave, Devans & Doyle

[57] ABSTRACT

Recessed isolation oxide is deposited in shallow trenches simultaneoulsy with oxide deposition in deep isolation trenches. A single planarization of both trench fillings provides efficient recessed isolation oxide without bird's beak or bird's head problems of LOCOS isolation oxide. Self-aligned trench filling by successive conformal depositions of oxide and polysilicon followed by planarization to remove polysilicon away from the trenches. The the remaining polysilicon may be used as an oxide etch mask to remove all of the oxide except in the trenches.

8 Claims, 11 Drawing Sheets

METHOD FOR FORMING RECESSED OXIDE ISOLATION CONTAINING DEEP AND SHALLOW TRENCHES

This is a division of application Ser. No. 07/935,765 filed on Aug. 26, 1992 now U.S. Pat. No. 5,382,541.

BACKGROUND AND SUMMARY OF THE INVENTIONS

The present invention relates to electronic integrated circuits and methods of fabrication, and, more particularly, to dielectrically isolated semiconductor integrated circuits and related fabrication methods.

Deep Trench isolation

As the packing density and operating frequency of integrated circuits has increased, the limitations of LOCOS isolation in silicon, both for bipolar and field effect devices, have become problems as described below. Trench isolation solves some of the LOCOS problems but introduces its own problems. In trench isolation, trenches of depth up to several μm are etched in the silicon substrate, a channel stop implant may be introduced at the trench bottoms, the sidewalls of such trenches are coated with an insulator such as silicon dioxide ("oxide"), and the remaining portion of the trench opening, if any, is filled, usually with polycrystalline silicon ("polysilicon"). However, deep trenches between transistors and shallow trenches within devices would be of different widths and depths and would require separate etching, filling (typically, deep trenches are filled with oxide and polysilicon, whereas shallow trenches are filled with oxide alone), and subsequent planarization steps. Thus, the processing steps become unwieldy.

Silicon-on-insulator substrates

Integrated circuits fabricated in silicon-on-insulator substrates offer performance advantages for both bipolar and field effect devices including low parasitic capacitance, low power consumption, radiation hardness, high voltage operation, freedom from latchup for CMOS structures, and the possibility of three dimensional integration. Indeed, isolation trenches extending through the silicon layer down to the insulation provide a simple approach to dielectric isolation of integrated circuit devices. Fabrication of devices on the silicon islands between the trenches typically follows standard silicon processing, including the usual LOGOS for lateral isolation by local oxide growth.

Additionally, silicon-on-insulator technology using very thin films offers special advantages for submicron devices. Scaling bulk devices tends to degrade their characteristics because of small-geometry effects, such as punch-through, threshold voltage shift, and subthreshold-slope degradation. The use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: for example, wafer bonding as described by J. Lasky et al., Silicon-On-Insulator (SOI) by Bonding and Etch-Back, 1985 IEDM Tech.Deg.684. and alternatively described in U.S. Pat. No. 5,266,135, and assigned to the assignee of the present application. These bonding methods essentially fuse two silicon wafers (a device wafer and a handle wafer) with an oxide layer and then thin the device wafer down to form the silicon-on-insulator layer. FIG. 1 shows such a bonded wafer 100 in cross sectional elevation view with silicon-on-insulator layer 102, oxide insulation layer 104, handle wafer 106. Deep isolation trenches 110 also appear in FIG. 1 with oxide 108 coated sidewalls and filled with polysilicon 112.

In known bonded wafer technology, to decrease parasitic capacitances in bipolar transistors and to increase transistor $f_T$, a thick oxide layer may be used between the extrinsic base and the collector. In order to minimize surface undulation, this oxide is completely recessed. The method of fabricating such an oxide layer is the well known LOCOS technology. LOCOS technology, however, is not capable of producing a completely recessed oxide. During processing a so called 'Bird's Head' and 'Bird's Beak' develop at the perimeter of the oxide. See FIG. 2 showing the same items as FIG. 1 plus LOCOS oxide 120 with Bird's Head and Bird's Beak. The Bird's Head causes step coverage difficulties. The Bird's Beak is a lateral encroachment by the oxide, resulting in larger than necessary recessed oxide. The consequence of the Bird's Beak is that the contact areas of the base and collector of the bipolar transistor has to be increased, thus increasing the size of the whole transistor. It is known that by decreasing the transistor dimensions the high frequency performance of the transistor will increase. Therefore it is very important to minimize or completely eliminate the Bird's Head and Bird's Beak from the recessed oxide. Further, the growth of LOCOS oxide yields a stressed oxide which limits the thickness that can be tolerated.

Features

The present invention provides recessed isolation oxide for both bipolar and field effect devices with both deep and shallow isolation trenches which are simultaneously filled and planarized. This eliminates the typical shallow trench Bird's Head and Bird's Beak of LOCOS without excessive processing steps and in conjunction with deep trench processing. Further, it is compatible with bonded wafer processing as well as conventional processing.

BRIEF DESCRIPTION OF THE DRAWINGS

The present invention will be described with reference to the accompanying drawings, which are schematic for clarity.

DESCRIPTION OF THE PREFERRED EMBODIMENTS

First Isolation Method

Figure 1:
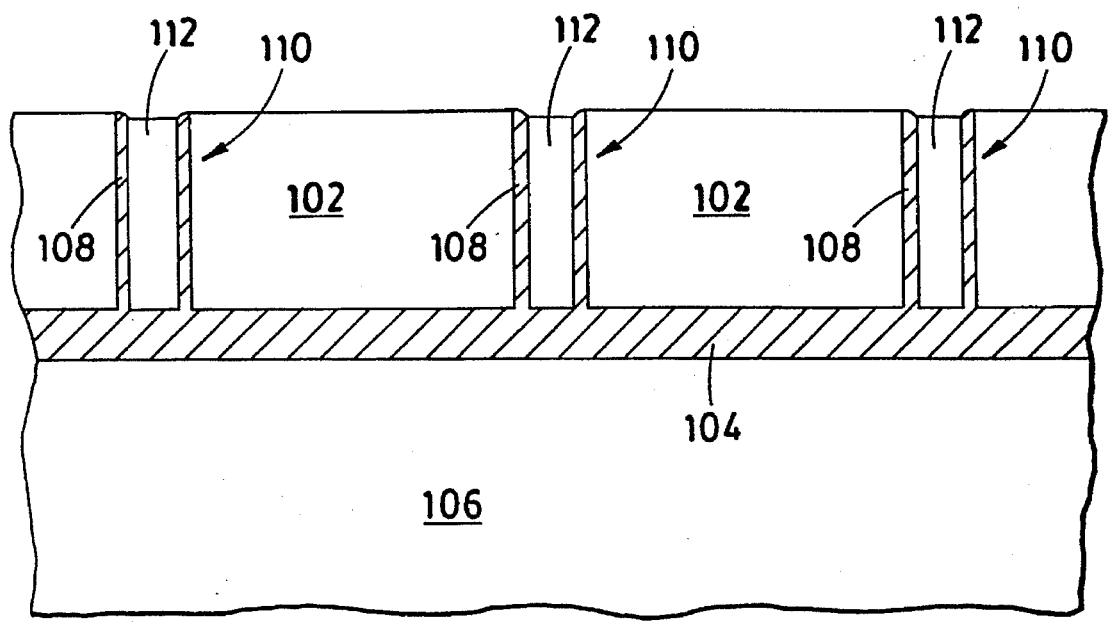
FIGS. 1–2 illustrate in cross sectional elevation views known bonded wafers with trench and LOCOS isolation.
Figure 2:
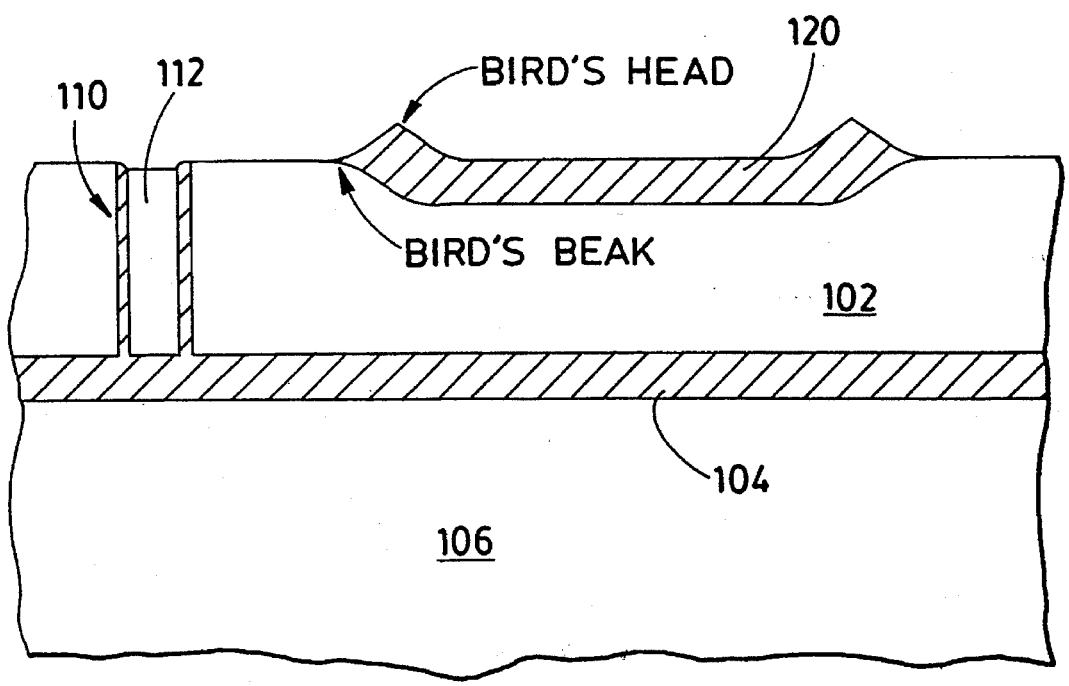

FIGS. 3a–k illustrate in cross sectional elevation views the steps of a first preferred embodiment method of isolation in the example of bipolar transistor fabrication in bonded wafer processing. Other substrates could be used with essentially the same method steps. The method proceeds as follows:

(a) Begin with, for example, a 4-inch diameter bonded silicon wafer 300 which includes silicon-on-insulator device layer 302 of doping type and resistivity (e.g., N type and 6–20 ohm-cm resistivity) desired for eventual device fabrication and with thickness of about 6 μm, bottom oxide 304 of thickness 2 μm, and handle wafer 306 of typical wafer thickness 525 μm. Of course, other diameters, resistivities, and thicknesses could be used. If a blanket buried layer in the final device sturctures is desired, then prior to the bonding of the device and handle wafers, the eventual buried layer would be formed by doping the device wafer 302 on the face to be oxidized to bottom oxide 304. Alternatively, the methods of Delgado and Bajor, U.S. Pat. No, 4,897,362, could be used to provide selective buried layers. See FIG. 3a.

(b) Thermally grow oxide of thickness about 500 Å on device layer 302 and then deposit undoped silica glass (USG) to a thickness of about 1 μm on the thermal oxide. This compound oxide layer 326 will be used as a trench etch mask. See FIG. 3b.

(c) Print a trench pattern into photoresist spun onto mask oxide 326. Use the patterned photoresist as etch mask to plasma etch the trench pattern in oxide 326. Then strip the photoresist and use the patterned oxide 326 to plasma reactive ion etch (RIE) device layer 302 down to bottom oxide 304 to form trenches 310. See FIG. 3c and note that the RIE also thins mask oxide 326 down to a thickness of about 2000–4000 Å. Trenches 3 10 have widths of about 3 μm.

Figure 3A:
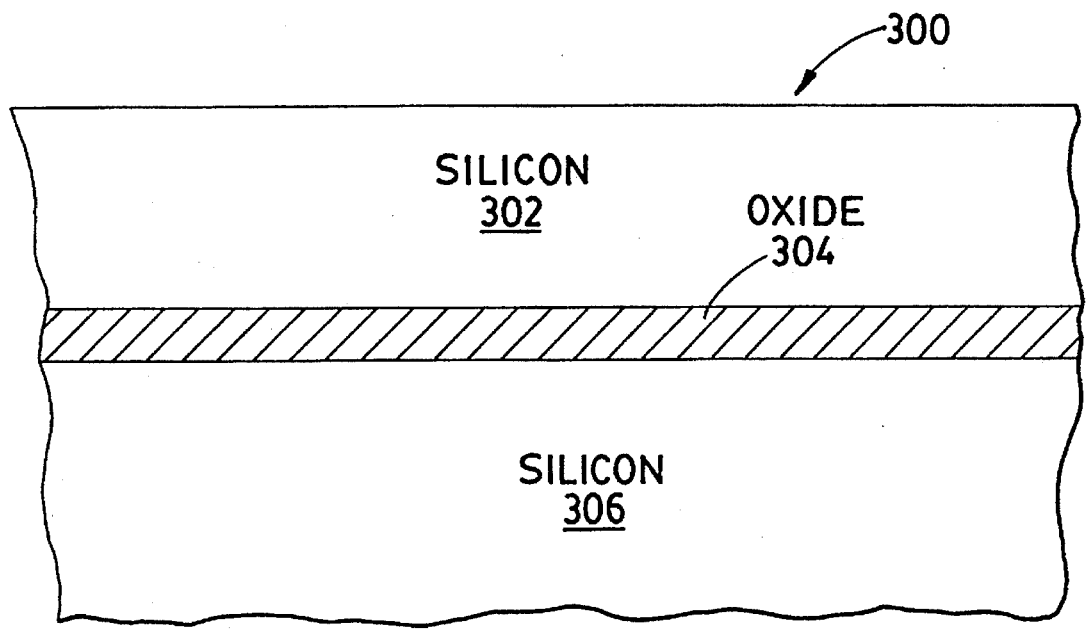
FIGS. 3a–k are cross sectional elevation views of a first preferred embodiment method of isolation compatible with bonded wafer processing.
Figure 3B:
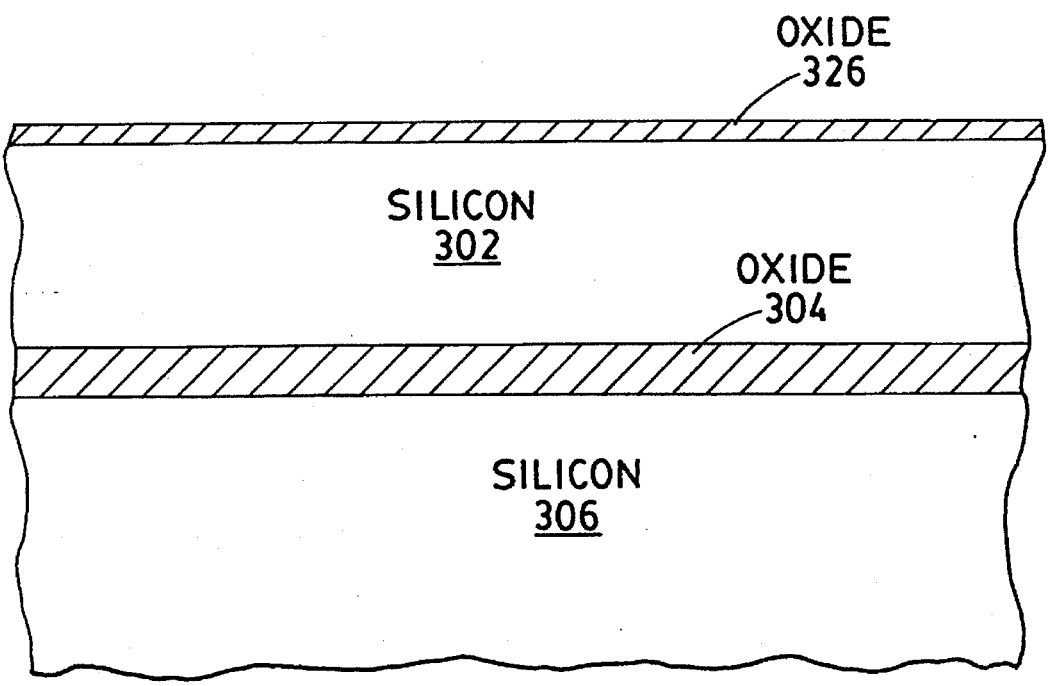
Figure 3C:
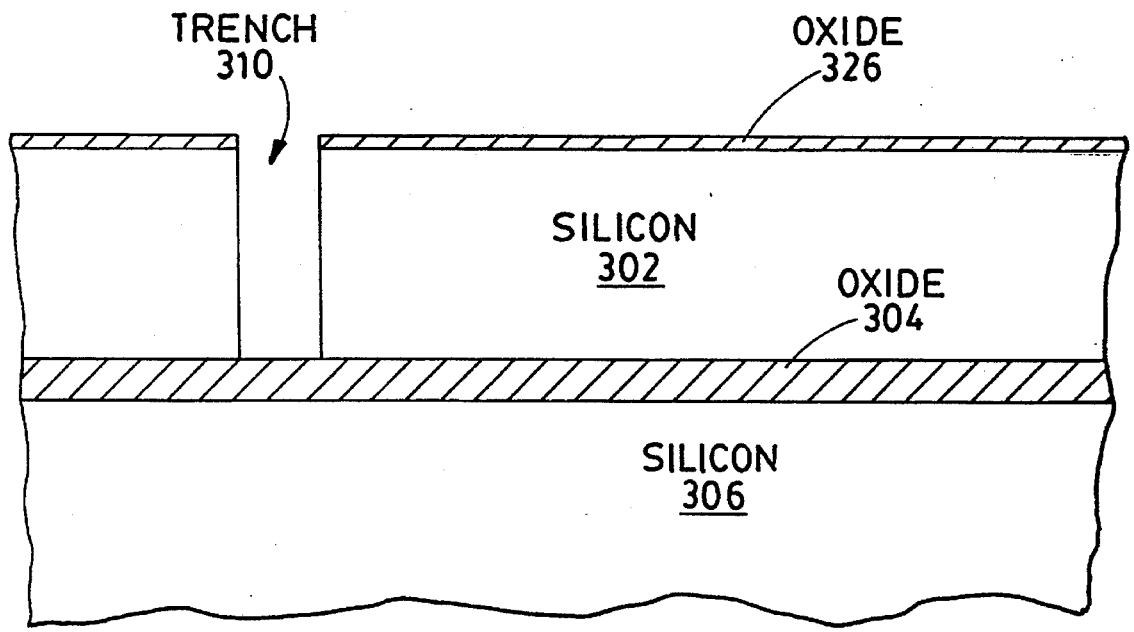
Figure 3D:
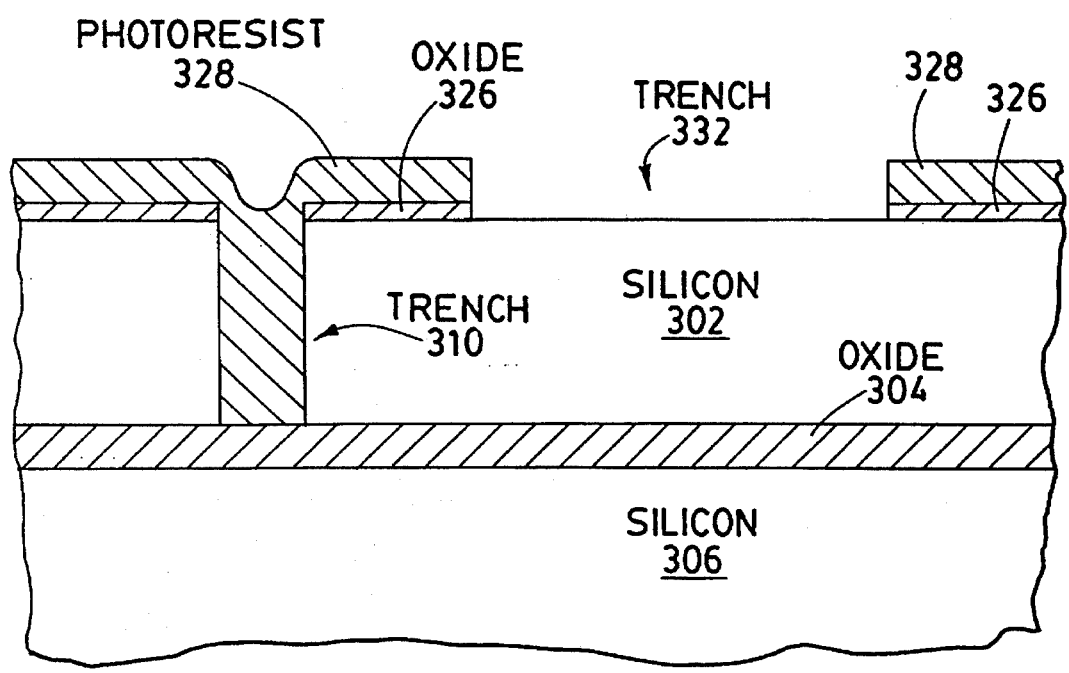
Figure 3E:
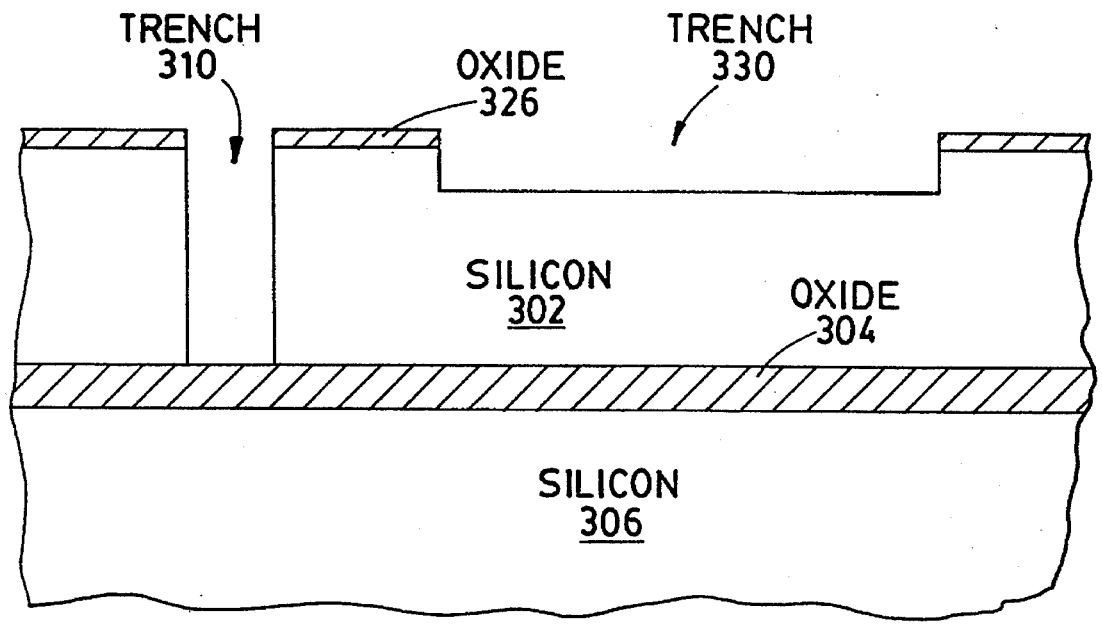
Figure 3F:
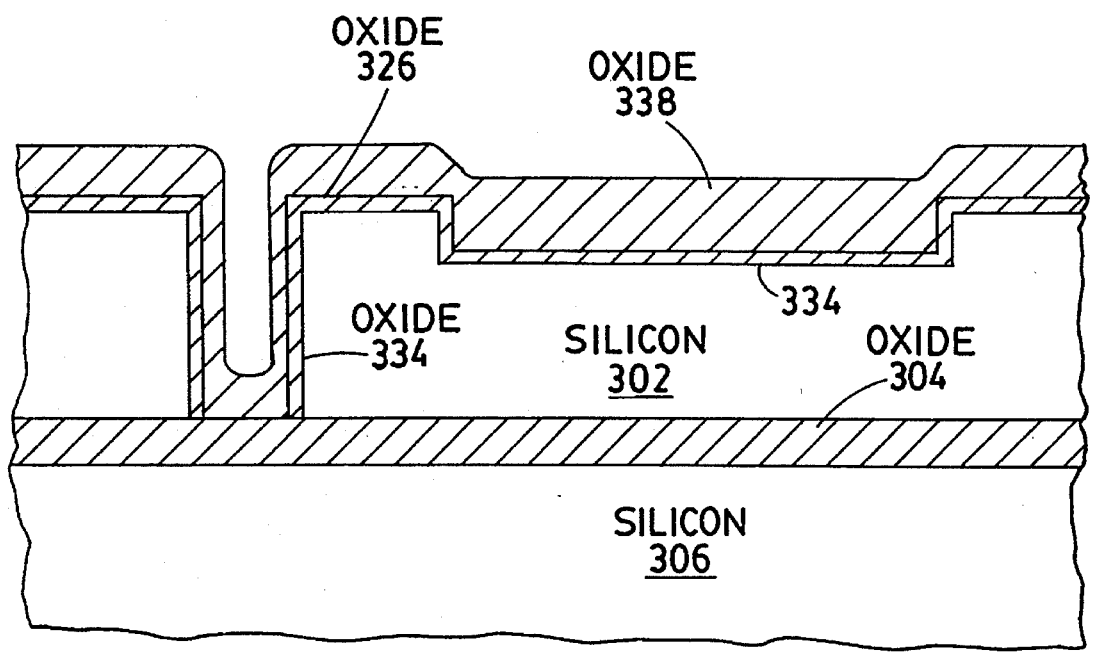
Figure 3G:
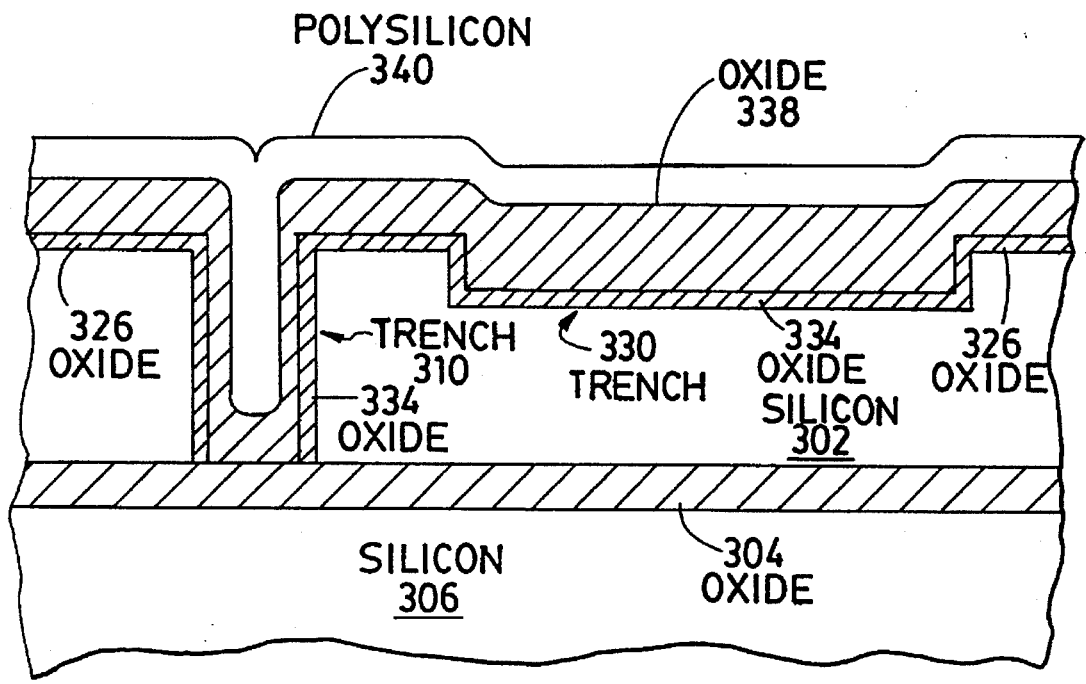
Figure 3H:
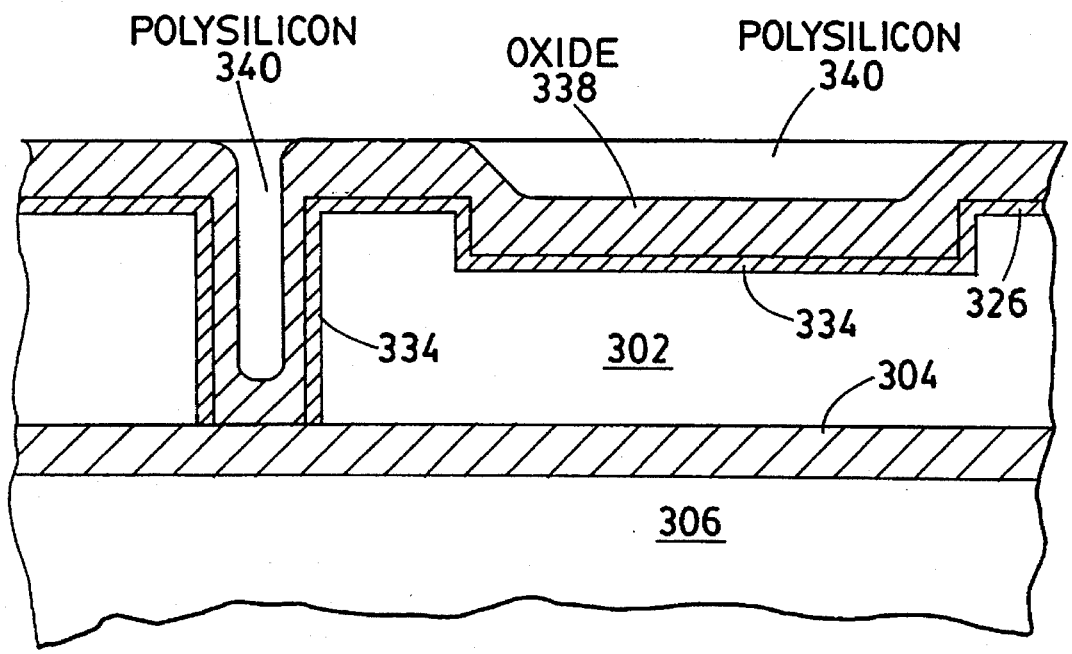
Figure 3I:
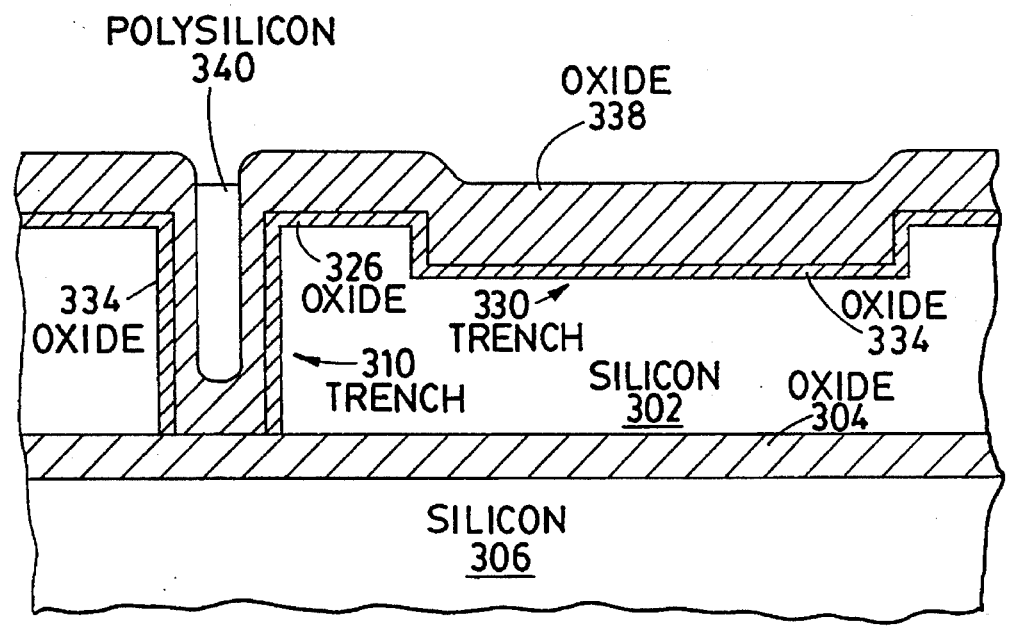

(d) Leave patterned oxide 326 in place and spin on photoresist 328. Photoresist 328 fills trenches 310 but with an indentation as illustrated in FIG. 3d. Print a recessed oxide pattern into photoresist 328, and use the patterned photoresist as an etch mask for a plasma etch of oxide 326. See FIG. 3d showing oxide 326 removed in recessed oxide pattern 332.

(e) Strip photoresist 328 and plasma etch (He-Cl$_2$ or HBr) shallow (1.5 μm) trenches 330 which will eventually contain the recessed oxide. The patterned oxide 326 serves as the etch mask, and trenches 310 may experience a slight widening depending upon the anisotropy of the etch. See FIG. 3e.

(f) Thermally grow thin (500 Å) oxide 334 to create a good oxide-silicon interface for both the sidewalls of trenches 310 and sidewalls and bottom of shallow trenches 330. This also slightly thickens oxide 326 and oxide 304 at the bottom of trenches 310. Then deposit about 1.5 μm of oxide 338 by decomposition of tetraethoxyorthosilicate ("TEOS"). TEOS layer 338 has to be at least as thick as the the depth of shallow trench 330 but need not fill deep trenches 310. The thickness of TEOS layer 338 is greater than the depth of shallow trenches 330 but less than half of the width and depth of deep trenches 310. See FIG. 3f which illustrates the conformal nature of TEOS deposition. In general, one may form a conformal dielectric layer in trenches 310, 330 where the layer has a thickness greater than the depth of trench 330 but less half the width of the trench 310.

(g) Deposit polysilicon 340 by low pressure chemical vapor deposition ("LPCVD") to a thickness of about 2 μm; this suffices to fill trenches 310. See FIG. 3g. LPCVD provides a conformal layer of polysilicon.

(h) Polish excess polysilicon 340 from the surface above TEOS oxide 338 to form a planar top surface. This polishing may be performed mechanically with alumina and diamond powder slurries or with the addition of a silicon etchant. See FIG. 3h.

(i) Plasma etch polysilicon 340 to remove it from shallow trenches 330 and to recess it in the deep trenches to the level of the surface of silicon layer 302. See FIG. 3i. Note that the polishing step (h) could have been omitted if the plasma etch rate of polysilicon 340 could be controlled so the loading effects when polysilicon 340 clears from oxide 338 will not lead to overetching polysilicon 340 in deep trenches 310.

(j) Spin on photoresist 350 to a thickness of about 2 μm. This provides a planar surface with coverage of steps of up to 1.5 μm in oxide 338. See FIG. 3j.

Figure 3J:
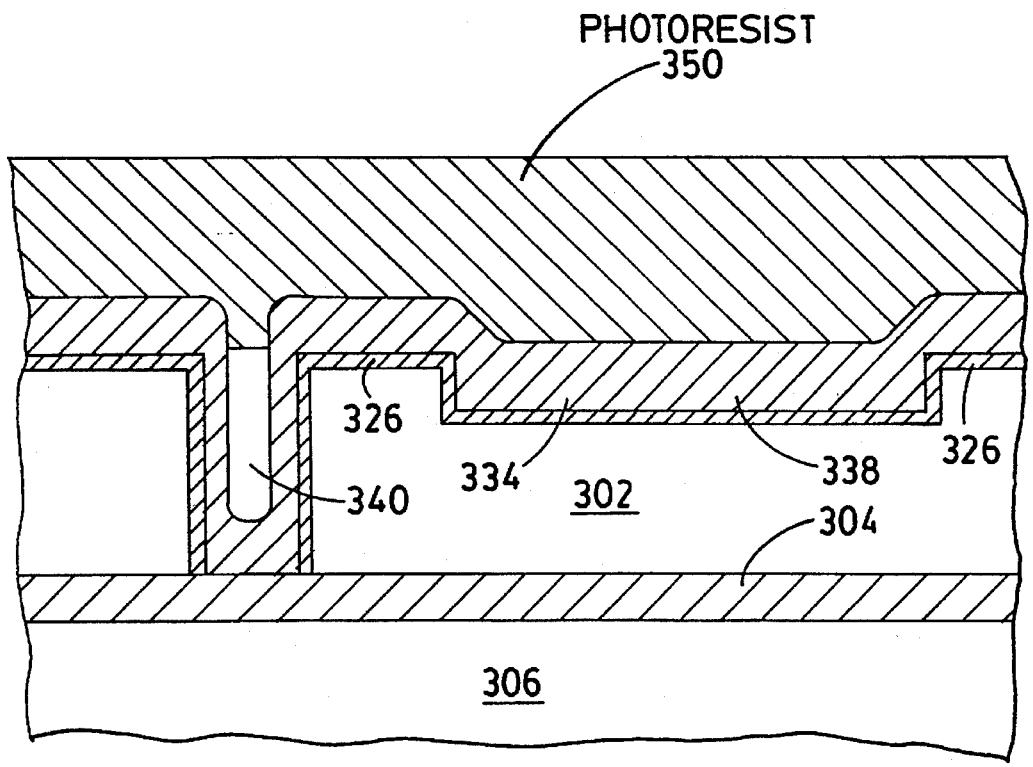
Figure 3K:
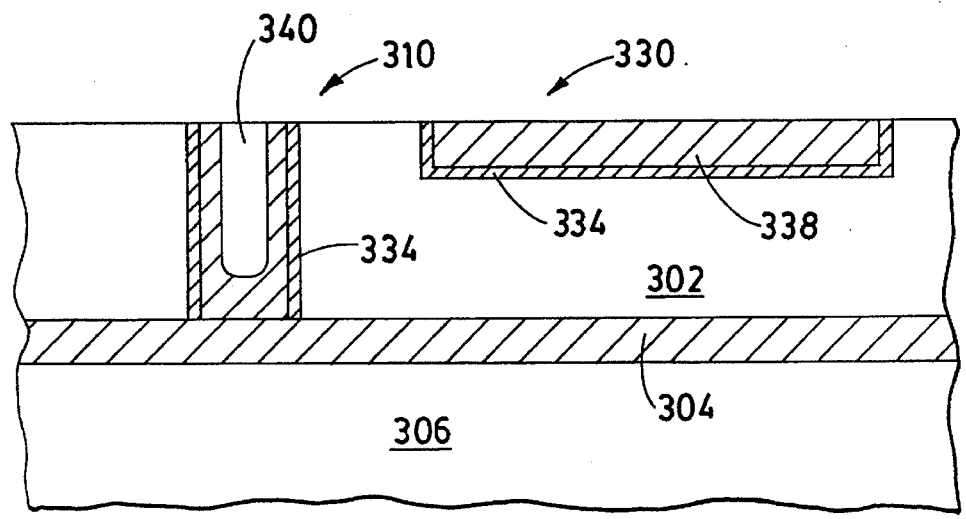

(k) Plasma etch photoresist 350 and oxide 338 to the surface of silicon layer 302. This plasma etch process can be adjusted to etch photoresist 350 and oxide 338 with the same etch rate. Because the photoresist surface is expected to be practically planar, this etch will planarize the oxide. See FIG. 3k which shows the result of the plasma etch once oxide 326 has been cleared from silicon layer 302. Trenches 310 partiton silicon layer 302 into islands, and recessed oxides (made of about 1 μm of TEOS oxide 338 on 500 Å of thermal oxide 334) have been formed in the shallow trenches 330 in the islands. Note that photoresist printing in step (d) determines the size and location of recessed oxide trenches 330 without any Bird's Head or Bird's Beak effects. On large area shallow trenches the photoresist will not have a flat surface, as shown in FIG. 3j, but will follow the surface of the shallow trench. This will prevent using photoresist planarization for large area shallow trenches.

(l) Fabricate devices in the silicon islands. The particular fabrication steps used will depend upon the types of devices, interconnection structure, and insulations desired and can include oxide growth and deposition, photoresist patterning, wet and dry etches, diffusions and implants, various material depositions such as polysilicon and silicon nitride, epitaxial layer growth, deposition of various metals such as aluminum an tungsten, and chemomechanical polishing.

Figure 4:
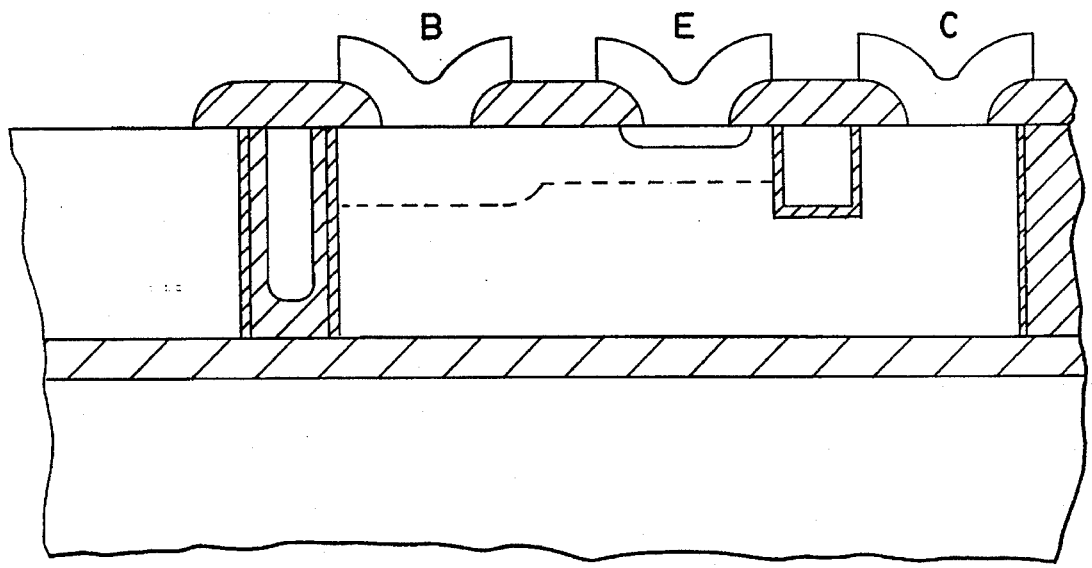
FIGS. 4 is a cross sectional elevation view of a bipolar transistor fabricated in an isolated wafer using the preferred embodiment method.
Figure 5A:
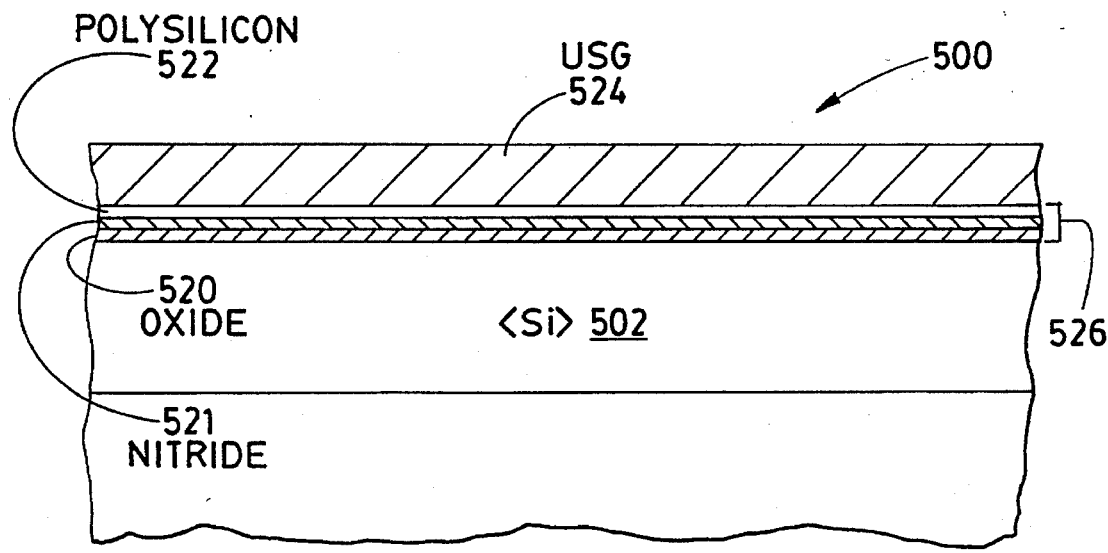
FIGS. 5a–f are cross sectional elevation views of a fourth preferred embodiment.
Figure 5B:
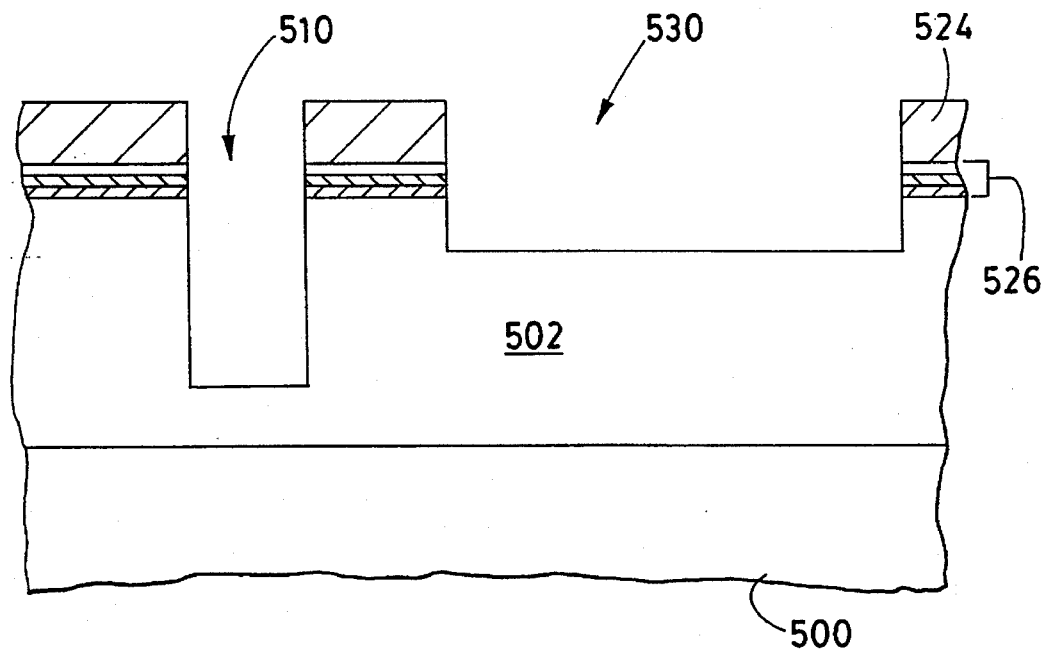
Figure 5C:
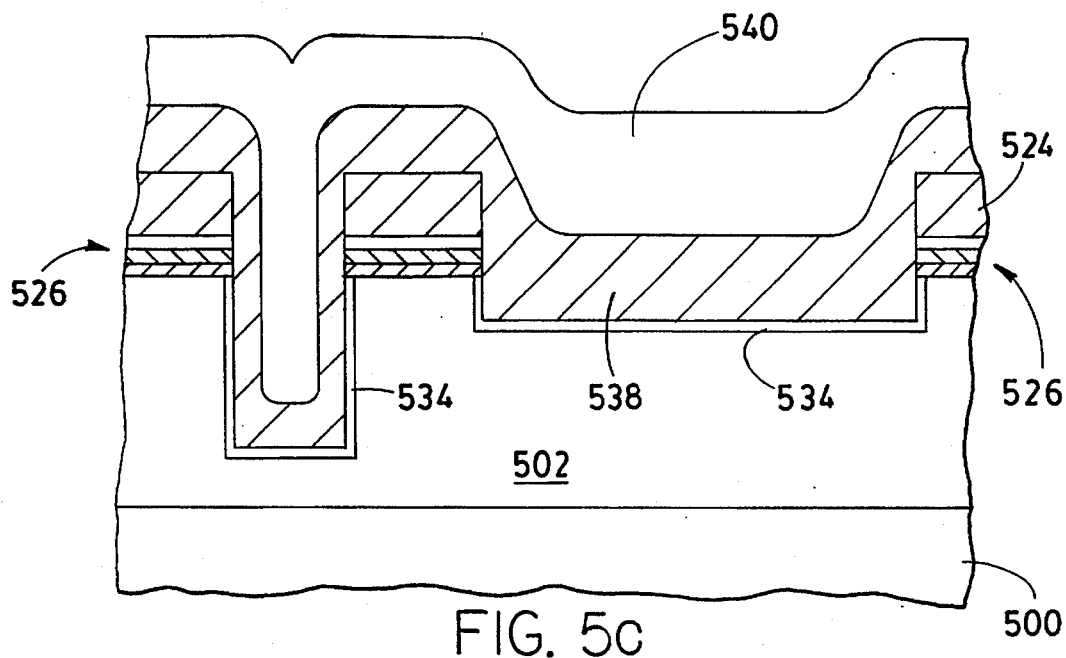
Figure 5D:
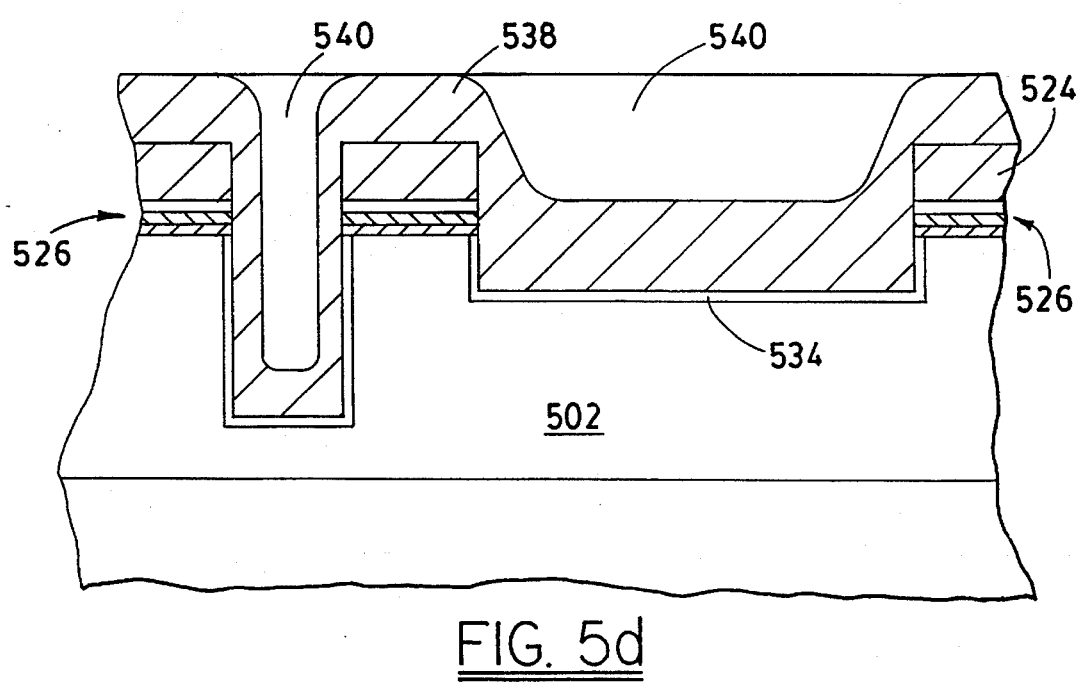
Figure 5E:
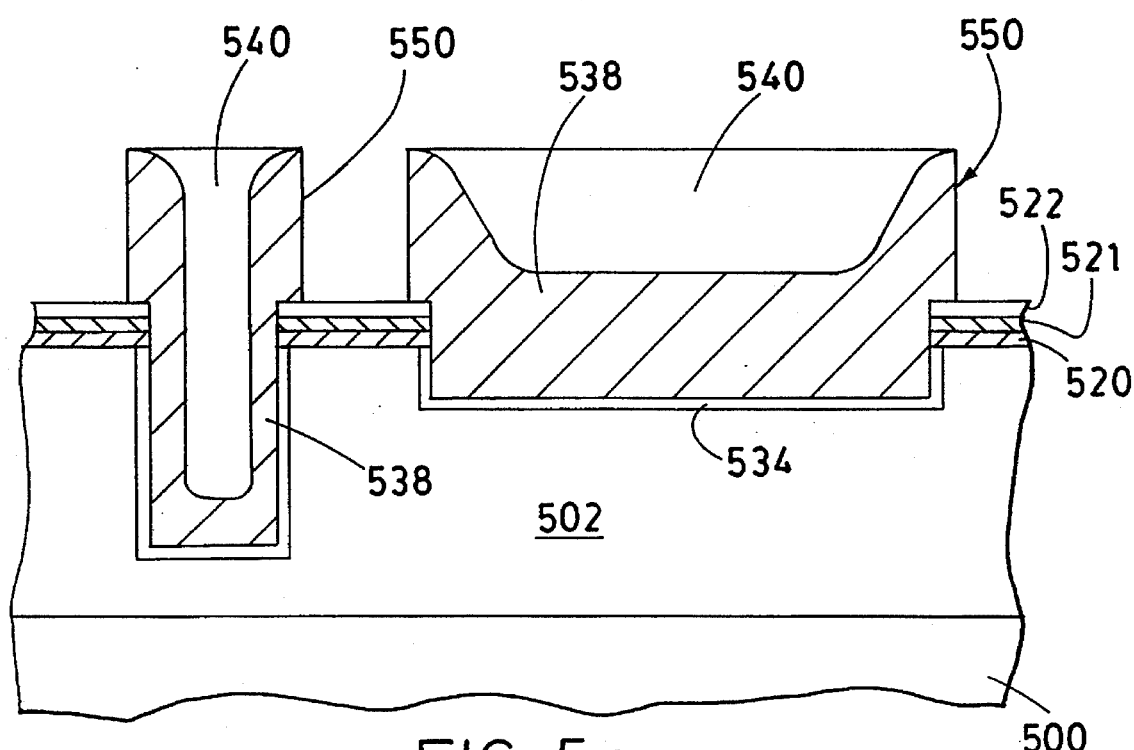
Figure 5F:
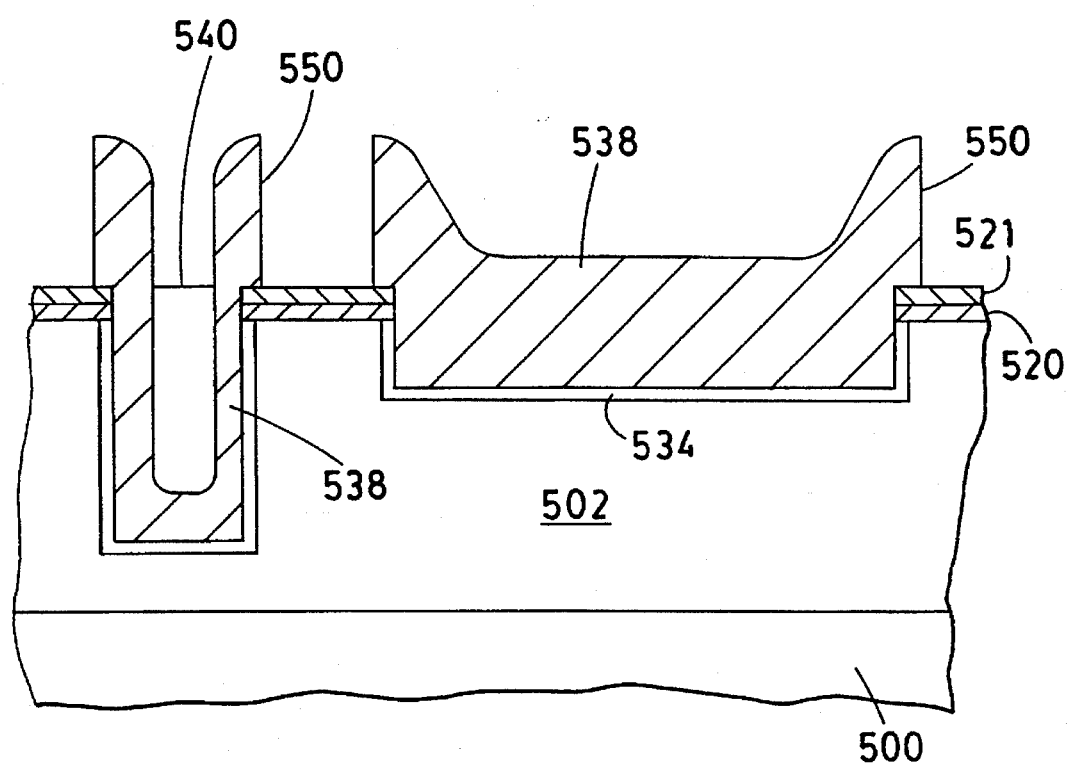

FIG. 4 schematically shows in cross sectional elevation view a bipolar transistor with shallow trench isolation between the collector contact and the intrinsic base and deep trench isolation about the periphery.

Second Isolation Method

A second preferred embodiment method of isolation follows the steps of the first preferred embodiment method except step (e) is changed to the following step (e$_2$) in which the patterned photoresist remains to protect the deep trench sidewalls. The photoresist will protect the deep trenches provided that the deep trenches are as narrow as 2 μm:

(e$_2$) Plasma etch (He-Cl$_2$ or HBr) shallow (1.5 μm) trenches 330 which will eventually contain the recessed oxide. The patterned photoresist 328 plus oxide 326 serve as the etch mask with photoresist 328 protecting the sidewalls of trenches 310. Then strip photoresist 328.

Then continue with step (f) of the first preferred embodiment method.

Third Isolation Method

A third preferred embodiment method of isolation follows the steps of the first preferred embodiment method except steps (d)–(e) are changed to the following steps (d$_3$)–(e$_3$) which replace mask oxide 326 with a new oxide for deep trench sidewall protection during the shallow trench etch:

(d$_3$) Strip patterned oxide 326, and thermally grow thin (500 Å) oxide to provide a good oxide-silicon interface. Deposit 1000 Å thick TEOS for trench sidewall protection and for shallow trench masking. Spin on photoresist and print it with the shallow trench pattern. Etch the oxides (500 Å of thermal under the 1000 Å of TEOS) with the patterned photoresist as etch mask; because the oxide is thin, even poor photoresist step coverage is expected to provide adequate protection at the edges of the deep trenches.

(e₃) Strip the patterned photoresist. Etch shallow trenches in the silicon using the patterned thin oxide as etch mask.

Then continue with step (f) of the first preferred embodiment method.

Fourth Isolation Method

A fourth preferred embodiment method of isolation roughly follows the steps of any of the first three preferred embodiment methods except a multilayer of oxide, silicon nitride (optional), and polysilicon replaces oxide layer 326. In particular, the steps of the fourth preferred embodiment method are illustrated in FIGS. 5a–f for the example of bulk silicon as follows:

(a) Begin with, for example, a 6-inch diameter silicon wafer 500 which includes epitaxial device layer 502. Thermally grow oxide 520 of thickness 500 Å on device layer 502 and then first deposit 2000 Å of undoped polysilicon 522 on the oxide and then deposit undoped silica glass (USG) 524 to a thickness of about 1 μm on polysilicon 522. Optionally, a 1000 Å layer 521 of silicon nitride ("nitride") could be deposited on oxide 520 before deposition of polysilicon 522 and USG 524. This multilayer 526 of oxide 520, nitride 521, and polysilicon 522 plus USG 524 will be used as a trench etch mask. See FIG. 5a which shows multilayer 526 with the nitride option.

(b) Print a deep trench pattern into photoresist spun onto multilayer 526 plus USG 524. Use the patterned photoresist as etch mask to etch the deep trench pattern in multilayer 526 plus USG 524; this may be multiple etches to account for the various materials in the multilayer 526. Then strip the photoresist and use the patterned multilayer 526 plus USG 524 to plasma reactive ion etch (RIE) device layer 502 down to a depth of 4 μm to form deep trenches 510. Leave patterned multilayer 526 plus USG 524 in place and spin on photoresist (this is following the first preferred embodiment method). The photoresist fills trenches 510. Print a recessed oxide pattern into the photoresist and use the patterned photoresist as an etch mask for a multietch of multilayer 526 plus USG 524. Strip the photoresist and plasma etch (He-Cl₂ or HBr) shallow (1.5 μm) trenches 530 which will eventually contain the recessed oxide. The patterned multilayer 526 plus USG 524 serves as the etch mask. See FIG. 5b.

(c) Thermally grow thin (500 Å) oxide 534 to create a good oxide-silicon interface for both the sidewalls and bottom of deep trenches 510 and sidewalls and bottom of shallow trenches 530. Then deposit about 1.5 μm of oxide 538 by decomposition of TEOS. TEOS layer 538 has to be at least as thick as the the depth of shallow trench 530. TEOS deposition yields a conformal oxide which coats trenches 510. Deposit polysilicon 540 by LPCVD to a thickness which fills trenches 510. See FIG. 5c. LPCVD provides a conformal layer of polysilicon.

(d) Polish excess polysilicon 540 from the surface above TEOS oxide 538 to form a planar top surface. This polysilicon polish may be performed with fine diamond grit in a slurry containing a silicon etchant. The removal rate of oxide is much less than that of polysilicon, and thus the polishing can be effectively stopped. See FIG. 5d.

(e) Plasma etch TEOS oxide 538. The polysilicon sublayer 522 of the multilayer 526 will act as an etch stop. The polysilicon trench fill 540 will mask both oxide 538 in the deep and shallow trenches and also a small area of the oxide at the perimeter of the trenches, thus creating oxide stringers 550 above the wafer surface. See FIG. 5e. Thus the oxide etch is self-aligned to the trenches by polysilicon 540 in the trenches.

(f) At this stage of the process, the top of the polysilicon fill 540 is higher than the surface of multilayer 526. The difference is the thickness of TEOS layer 538. These polysilicon islands that are sticking out form the surface (as mesas) are surrounded with oxide stringers 550. Plasma etch polysilcon 540 in the deep trenches down until the surface of polysilicon 540 is at about the same level as the surface of silicon 502. This etch also removes all polysilicon layer 522 from multilayer 526 and from the shallow trenches. This etch can be a timed etch or can be end pointed using the multilayer 526 area. Since the selectivity of the plasma etch between polysilicon and oxide is 15–20 to 1, the bottom oxide layer 520 of the multilayer 526 will not be etched away. See FIG. 5f which shows the polysilicon etch stopping at optional nitride 521.

(g) Spin on photoresist which will cover the oxide stringers. Plasma etching can be applied to remove the photoresist together with the stringers. This plasma etch has to have an etch selectivity of 1:1 between photoresist and oxide. Since the stringer area is small, no loading effect is anticipated. This etch should be a timed etch that has to be stopped before reaching the oxide layer 520 of multilayer 526. The plasma etch has to be continued using a high oxide to silicon selectivity to remove oxide layer 520 and stop at the single crystal silicon 502 surface.

(h) Fabricate devices in the silicon islands as in step (1) of the first preferred embodiment.

Fifth Isolation Method

Figure 6:
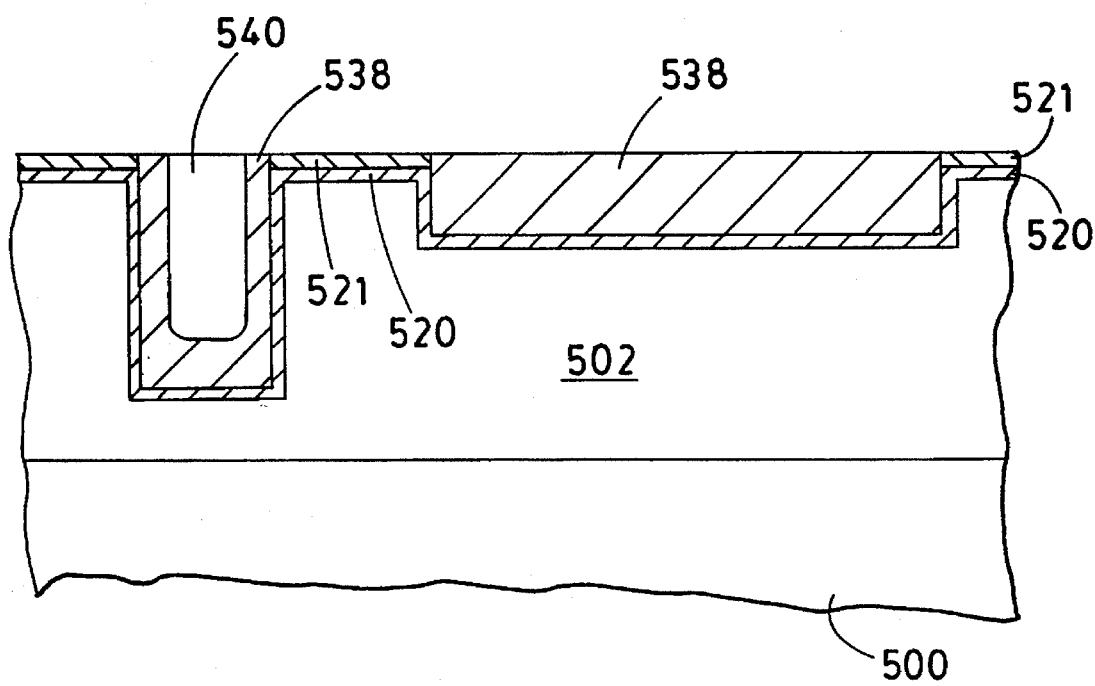
FIG. 6 illustrates another preferred embodiment method in cross sectional elevation view.

The fifth preferred embodiment method follows the steps of the fourth preferred embodiment method except the planarization of steps (f)–(g) is replaced by a polish planarization. Polish planarization can be used to remove the polysilicon 540 mesas together with the polysilicon layer 522 of multilayer 526. The bottom oxide layer 520 of the multilayer will act as a polish-stop, because the polysilicon polishing rate is significantly larger than that of the oxide layer 520. Since the area of the oxide stringers is very small compared to the polysilicon mesa area, the presence of the stringers will practically not influence the polishing rate of the polysilicon mesas. Also, the fact that the stringers protrude from the wafer surface implies the polishing eliminates them despite the slow removal rate of oxide. Optional nitride layer 521 can also be used as a polish stop since the polishing selectivity between the polysilicon and the silicon nitride is larger than the selectivity between the polysilicon and the oxide. FIG. 6 shows wafer 500 with nitride layer 521 after polishing.

Advantages

The preferred embodiment methods have the advantages of eliminating the Bird's Head and Bird's Beak of LOCOS, and also the stress generated by grown oxide. Indeed, the thin thermal oxide coating of the deep and shallow trenches provides the good electrical interface, and the deposited oxide provides insulation without grown oxide stresses. Further, the shallow trenches may be placed anywhere on the device layer, including overlapping the deep trenches.

The planarization using the multilayer as in FIGS. 5d–f and 6, is self-aligned and could be used even without the deep trenches. That is, trenches may be filled with a conformal oxide (or other dielectric) deposition and this is followed by a conformal polysilicon deposition over the oxide and a polysilicon planarization to leave polysilicon on the oxide only over the trenches. Thus the oxide in the trenches is masked by the polysilicon in a self-aligned manner, and an oxide etch can selectively remove the oxide outside of the trenches.

Modifications and Variations

The preferred embodiment methods may be varied in many ways while retaining one or more of the features of deep filled trench isolation and shallow filled trench isolation formed together and use of self-aligned trench dielectric removal.

For example, various deep trench etching methods could be used, including ECR plasma and redeposition plasma to provide a slight taper in the trenches. The deep trenches could be filled entirely with insulator. The dimensions could be varied over a large range: the silicon-on-insulator layer thickness could vary between a few µm and 100 µm, the shallow trenches could vary between a few thousand Å and a few µm, the deep trenches need not extend fully to any bottom oxide, the bottoms of the trenches could be doped for channel stops, the wafer diameter may be any size such as two inches or greater than eight inches. Other materials such as nitride could fill or partially fill the trenches, and the polysilicon fill could be a different material with an etch selectivity with respect to the first material deposited in the trenches. The bottom oxide could an agglomeration of various insulators such as nitride, sapphire, glasses and may even include conductors. The thermal oxide coating of the trenches could be omitted. Other material systems could be used, such as gallium arsenide bonded to silicon with nitride insulator.

What is claimed is:

1. A method of bonded wafer processing, comprising the steps of:
   (a) providing a bonded wafer including a device layer, an insulating layer, and a handle wafer;
   (b) forming trenches of a first depth in said device layer;
   (c) forming trenches of a second depth in said device layer with said second depth differing from said first depth;
   (d) forming dielectric simultaneously in said trenches of a first depth and in said trenches of a second depth, said dielectric layer of thickness greater than said second depth, less than said first depth and less than half of the width of said trenches of a first depth; and
   (e) after said forming dielectric, planarizing said dielectric to remove said dielectric on said device layer and outside of both said trenches of a first depth and said trenches of second depth.

2. The method of claim 1, comprising the further step of:
   (a) after said forming dielectric but prior to said planarizing, filling said trenches of a first depth only with a semiconductor.

3. The method of claim 1, wherein:
   (a) said device layer is silicon;
   (b) said insulation layer is silicon oxide;
   (c) said semiconductor is polysilicon; and
   (d) said trenches of a first depth extend through said device layer to said insulation layer.

4. The method of claim 3, wherein:
   (a) said forming dielectric includes a thermal oxidation followed by an oxide deposition.

5. The method of claim 1, wherein:
   (a) said device layer is silicon, said insulation layer is silicon oxide; and
   (b) said trenches of a first depth extend through said device layer to said insulation layer.

6. The method of claim 5, wherein:
   (a) said forming dielectric includes a thermal oxidation followed by an oxide deposition.

7. A method of bonded wafer processing, comprising the steps of:
   (a) providing a bonded wafer including a device layer, an insulation layer, and a handle wafer;
   (b) forming a barrier layer on said device layer, said barrier layer including a semiconductor sublayer and a dielectric sublayer;
   (b) forming trenches through said barrier layer and extending a first depth into said device layer;
   (c) forming trenches through said barrier layer and extending a second depth into said device layer with said second depth differing from said first depth;
   (d) forming a conformal dielectric layer in said trenches and on said barrier layer, said conformal dielectric layer of thickness greater than said second depth, less than said first depth and less than half of the width of said trenches of a first depth;
   (e) forming a conformal semiconductor layer on said dielectric layer and filling said trenches of a first depth;
   (f) polishing said conformal semiconductor layer with said conformal dielectric layer as the polish stop to leave semiconductor portions in said trenches;
   (g) removing the exposed portion of said dielectric with said semiconductor sublayer as removal stop;
   (h) removing said semiconductor portions except for said semiconductor filling said trenches of a first depth with said dielectric including said dielectric sublayer as removal stop; and
   (i) planarizing said dielectric.

8. The method of claim 7, wherein:
   (a) said conformal semiconductor layer is silicon; and
   (b) said conformal dielectric layer is silicon oxide.

* * * * *